United States Patent [19]

Howell et al.

[11] 3,803,494

[45] Apr. 9, 1974

[54] PULSE TUNING CONTROL SYSTEM FOR RADIO RECEIVERS

[75] Inventors: John B. Howell, Sparks; Charles M. Dorsey, Baltimore; Reuben L. Stauffer, Hampton, all of Md.

[73] Assignee: The Bendix Corporation, Newport News, Va.

[22] Filed: Apr. 7, 1972

[21] Appl. No.: 242,026

[52] U.S. Cl. .................. 325/459, 325/335, 325/469

[51] Int. Cl. ............................................ H04b 1/06

[58] Field of Search ........... 325/452, 453, 455, 459, 325/464, 468, 469

[56] References Cited

UNITED STATES PATENTS 3,163,823 12/1964 Kellis et al. ......................... 325/453

3,573,734 4/1971 Williams et al. .................... 325/455

*Primary Examiner*—Robert L. Griffin

*Assistant Examiner*—Jin F. Ng

*Attorney, Agent, or Firm*—W. G. Christoforo; Bruce L. Lamb

[57] ABSTRACT

A pulse counter accumulates pulses from a pulse source. The count accumulated in the counter sets the divisor in the divider of a phase locked loop whose output frequency comprises the local oscillator frequency of the radio receiver. A number of memory devices are provided, each of which is capable of storing the instantaneous count contained in the pulse counter. The memorized count can subsequently be returned to the pulse counter to thus set the receiver local oscillator frequency to the frequency corresponding to the memorized count. Generally, pulses are applied to the pulse counter through a gate which is opened by manual manipulation of a switch to thus effect receiver tuning. Automatic receiver tuning is available by latching the gate open and providing a feedback circuit which responds to the presence of a carrier frequency in the receiver to unlatch the gate. A decoder continuously samples the state of the pulse counter to thus provide a receiver tuning indicator.

6 Claims, 3 Drawing Figures

PULSE TUNING CONTROL SYSTEM FOR RADIO RECEIVERS

BACKGROUND OF THE INVENTION

This invention relates to tuning control systems for radio receivers and more particularly to solid state pulse tuning control systems which operate on digital principles and where the tuning control system can selectively be manually tuned, pushbutton tuned or signal seeker tuned. The invention is particularly adaptable for use in automobile radio broadcast receivers.

Present day radio receivers are generally tuned through the use of mechanical devices such as linkages or pulleys where manual manipulation of a tuning knob acts through the mechanical device to vary the position of inductive or capactive elements in a tuner circuit. The position of the mechanical elements with respect to one another is generally related to the receiver local oscillator frequency and hence to the tuning of the receiver. It is thus merely necessary to provide an operator observable position of the mechanical elements with respect to one another to thus provide an indication of the receiver tuning. This usually takes the form of a pointer which is mechanically ganged to mechanical elements and is moved with respect to a dial scale as the position of the mechanical elements change. In addition, pushbuttons are available for automatically tuning the receiver to a desired station. The pushbuttons normally include a mechanical memory device for memorizing the position of the mechanical elements with respect to one another and for resetting this memorized position back into the mechanical elements when it is desired to tune the radio. In addition, signal seeker devices are known which include an electrical motor for automatically driving the mechanical tuning elements over their desired range until the receiver circuits indicate a station is received at which time the electric motor is turned off.

In reducing the size of radio receivers, as is desirable especially in radio receivers used in passenger automobiles, it has been found that the reduced proportions of the mechanical tuning elements magnify the tuning inaccuracies introduced through the mechanical elements. Varactor tuned receivers have been suggested to permit elimination of the mechanical tuning elements and reduce the size of the receiver. An adjustable circuit element, usually a resistance, is used to vary the varactor capacitance to thus tune the radio. The resistance adjustment is normally made through the use of a potentiometer. In this case pushbutton functions are performed by presetting a potentiometer associated with the pushbutton to be set to the desired station. This type of system does not, however, permit the practically automatic setting of pushbuttons that is now possible with mechanical devices nor does it permit a signal sought station to be set into a pushbutton.

SUMMARY OF THE INVENTION

The above described tuning control system provide a continuous tuning over the entire band of interest, usually the AM and FM radio bands. However, since the AM and FM radio bands are comprised of a plurality of individual adjacent channels, it is not necessary for proper operation of broadcast radio receivers that the tuning be done in this continuous manner. Indeed, tuning may be accomplished by stepping the local oscillator frequency from channel to channel much in the same manner as the VHF portion of the television band is tuned in domestic receivers. However, the large number of broadcast channels available, 100 on the FM band and 107 on the AM band, precludes the practical use of individual switches or knob positions for each of the broadcast channels. In any event, the invention makes use of the fact that the broadcast channels are equally spaced in frequency to provide digital tuning of the radio receiver.

Briefly, the invention includes a binary pulse counter and a source of signals, frequency or pulses, suitable for strobing the counter. A gating device which is controlled by an operator manipulated switch permits the signals to be applied to the counter. The instantaneous count contained in the counter is used by a code converter to set the divisor of a phase locked loop divider. The loop reference frequency is equal to the channel spacing between adjacent channels on the broadcast band to be tuned. If the counter is incremented or decremented by an applied pulse the divisor will increase or decrease suitably by one, depending upon the exact design of the circuitry. There will thus correspond a unique divisor for each different count or number in the counter. In addition, there is a different output frequency from the phase locked oscillator for each divisor. These frequencies separated by the band channel spacing will tune the receiver over the broadcast band.

In the embodiment to be described, two individual phase locked loops are shown, one of which is used to tune the AM band and the other used to tune the FM band. A band switch is also shown which is used to select the desired band by energizing the proper phase locked loop so as to select the proper local oscillator frequencies and also by altering the other receiver circuits as known to those skilled in the art.

A seven stage counter is used and is optionally internally connected to limit its range to 100 steps when switched to the FM band and 107 steps when switched to the AM band. These ranges, of course, correspond to the number of channels in the respective band. The means for range limiting suitable counters is well known and will not be further described.

Pushbutton functions are performed by solid state binary memories. An individual memory is shown provided for each pushbutton. Two unilateral gates are associated with each memory. A first gate when opened stores the binary number instantaneously contained in the counter into the memory. When the second gate is opened the number stored in the memory is entered into the counter. A double throw switch is actuated by the pushbutton and controls the opening of the various gates.

Signal seek function is simply provided by applying the pulses to the counter through a latching gate. The gate is unlatched when a carrier is detected in the receiver.

It is thus an object of this invention to provide a pulse tuning control system for radio receivers.

It is another object of this invention to provide a solid state tuning control system.

A further object of the invention is to provide a digitally controlled tuner.

A still further object of the invention is to provide a tuning system of the type described which includes pushbutton capability.

Another object of this invention is to provide a tuning system of the type described which includes signal seek capability.

One more object of this invention is to permit a signal sought station to be set into a pushbutton memory.

These and other objects of the invention will be made apparent as the description proceeds.

DESCRIPTION OF THE PREFERRED EMBODIMENT

Figure 1A:
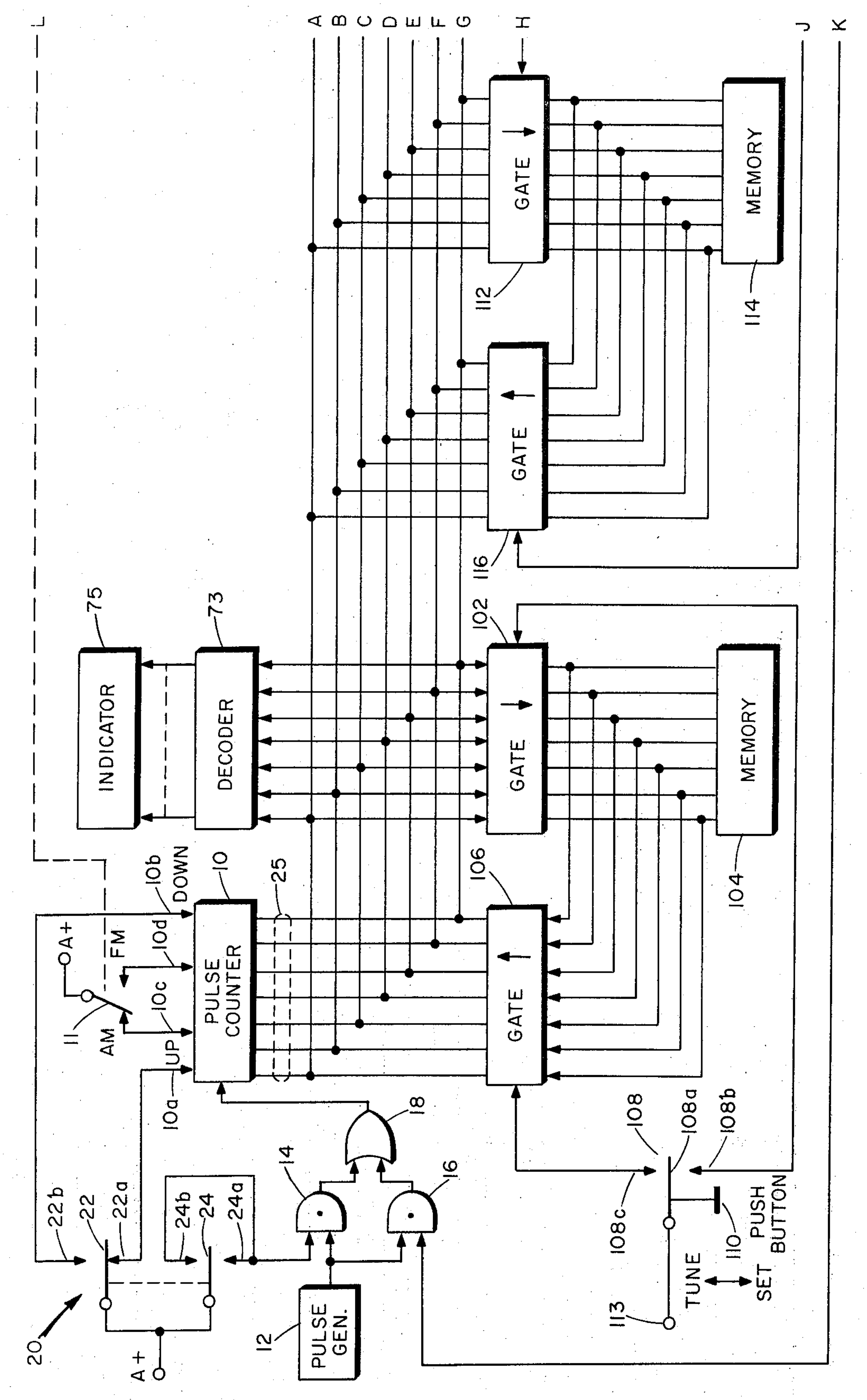
FIGS. 1A and 1B comprise a block diagram of the invention.
Figure 1B:
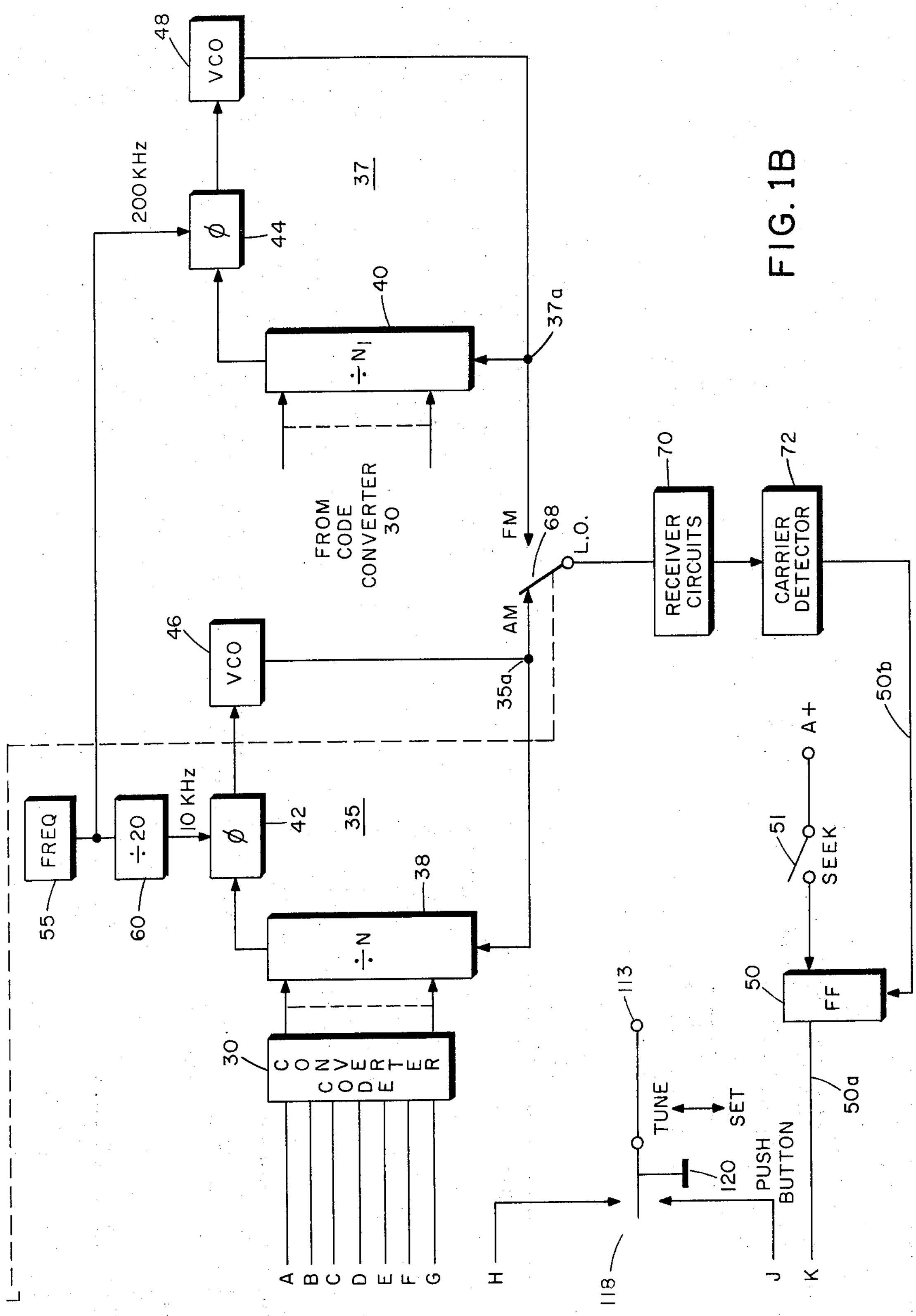

Refer to FIGS. 1A and 1B which include a pulse counter 10. This counter is suitably of the digital binary type and when used in a standard broadcast receiver comprises seven counter stages so that it has the capability of counting to 128. The counter accumulates pulses from a pulse generator or clock 12 and is configured internally so as to increment, that is, to add one to the instantaneous number contained therein for each clock pulse received if UP terminal 10*a* is energized and to decrement, that is, to subtract one from the instantaneous number for each clock pulse received if DOWN terminal 10*b* is energized. In addition, the pulse counter is internally wired to count less than its full range of 128. Specifically, when AM terminal 10*c* is energized, the counter will count through 107 distinct steps or numbers from an initial number to a final number and then return to the initial number. These 107 unique numbers correspond to the 107 AM channels. When terminal 10*d* is energized the counter will count from an initial number through 100 unique steps or numbers to a final number and then repeat. These 100 unique steps correspond to the 100 FM channels. The clock pulses are applied from clock 12 to counter 10 through the gating means comprised of AND gates 14 and 16 and OR gate 18. The gates are controlled by a flip flop 50 when the receiver is in a signal seek mode as will be explained below. The gates are further controlled by a manually manipulated switch 20 when the radio is manually tuned. Switch 20 includes switch arms 22 and 24 which are mechanically ganged together. Arms 22 and 24 are electrically connected to a signal source, here designated A+, which is suitable for controlling gate 14 and energizing counter 10 in its UP or DOWN mode. In its normal unactuated condition, switch arm 22 makes electrical connection with contact 22*a*, this latter contact being electrically connected to UP terminal 10*a*. In its normal unactuated condition switch arm 24 is open. If it is desired to add pulses to counter 10, which in this embodiment is equivalent to tuning from a relatively low frequency to a relatively higher frequency, it is merely necessary to manipulate switch 20 in the direction of contact 24*a* so that terminal 10*a* remains energized and terminal 24*a* is energized to thus open gate 14. Clock pulses then proceed from clock 12 and through gates 14 and 18 and to pulse counter 10. If it is desired to subtract pulses from counter 10, which in this embodiment is equivalent to tuning from a relatively higher frequency to a relatively lower frequency, it is merely necessary to manipulate switch 20 in the direction of contacts 24*b* and 22*b*. In this case, DOWN terminal 10*b* is energized together with terminal 20*b*. Since terminals 24*a* and 24*b* are electrically connected, gate 14 is once again opened and clock pulses pass from clock 12 to gates 14 and 18 to pulse counter 10 which now will subtract 1 from its instantaneous count for each clock pulse applied.

Seven leads, generally designated 25, are connected to pulse counter 10, one lead being connected to each stage of the counter. Leads 25 are applied directly to a code converter 30. The code converter provides the interface unit between the digital portion of the tuner and the phase locked loops 35 and 37 which comprise the analog portions of the tuner and which provide the local oscillator frequencies for the broadcast receiver. Phase locked loops 35 and 37 are conventional phase locked loops each of which is comprised of dividers 38 and 40, respectively, phase detectors 42 and 44, respectively and voltage controlled oscillators 46 and 48, respectively. In addition, a frequency source 55 applies a reference frequency at 200 KHz at the phase detector 44 of phase locked loop 37. This reference frequency of 200 KHz is equal to the 200 KHz channel spacing in the FM receiver broadcast band. It should be obvious that as divider 40 is varied one step at a time, the frequency at phase locked loop output terminal 37*a* will change in steps of 200 KHz.

The reference frequency is scaled down by a divide by 20 divider 60 so as to produce a second reference frequency at 10 KHz which is applied to phase detector 42. It should additionally be obvious that as divider 38 is changed by single step increments the output frequency at phase locked loop output terminal 35*a* will change by 10 KHz increments. This, of course, corresponds to the 10 KHz channel spacing in the AM receiver broadcast band.

Voltage controlled oscillators 46 and 48 are tuned respectively so that the output frequencies at terminals 35*a* and 37*a* comprise the necessary local oscillator frequencies to tune the receiver circuits 70 across the AM and FM radio receiver bands. These local oscillator frequencies are applied to circuits 70 through switch 68. Switch 68 is the receiver band switch and permits either the AM local oscillator frequencies at terminal 35*a* or the FM local oscillator frequencies at terminal 37*a* to be applied to the receiver circuit 70. Switch 68 is ganged to switch 11 which changes the range of counter 10 as earlier discussed.

As previously mentioned the code converter 30 provides the interface between the digital portion of the tuner circuitry and the phase locked loops. The code converter comprises any suitable element which will convert the instantaneous count contained in pulse counter 10 to an integer N for divider 38 and to an integer $N_1$ for divider 40 suitable to permit the proper local oscillator frequencies to be generated by the phase locked loops over the entire bands. Of course, a unit change in pulse counter 10 will produce a unit change in the divisor of dividers 38 and 40.

Leads 25 are also directly connected to a decoder 73 whose output is applied to an indicator 75. The function of the indicator is to provide an operator observable indication of the particular point in the broadcast band to which the receiver is tuned. Decoder 73 might suitably be comprised of a D/A converter which generates an analog voltage corresponding to the number in counter 10. In this case, indicator 75 will comprise a voltmeter calibrated with the standard radio broadcast receiver band. Alternately, indicator 75 might comprise a linear array of light emitting diodes arranged against a standard radio receiver dial scale. In this case decoder 73 will comprise a steering network which will illuminate a particular light emitting diode in response to a particular number in counter 10. Indicator 75 might include the number of light emitting diodes equal to the pulse capacity of counter 10 or a submultiple or approximate submultiple thereof. Since radio broadcast stations are not popularly designated by their channel, it is not necessary that the indicator provide an exact indication of the particular channel to which the receiver is tuned. It is merely necessary that the indicator provide such approximate indication of the position in the band to which the receiver is tuned. It is desirable, however, that a particular setting for a particular station be repeatable. The digital nature of the pulse counter and decoder will provide the resettability desired. In addition, due to the approximate nature of the indicator the fact that there are 100 channels in the FM and 107 in the AM band will be inconsequential.

Leads 25 are also connected as inputs to a plurality of gates 102 and 112. The output of these gates are applied respectively to memories 104 and 114. Each of these memories is a seven stage memory suitably comprised of seven binary elements able to record the instantaneous state of pulse counter 10 when its respective gate 102 or 112 is opened. Associated with each memory 104 and 114 is a second gate 106 and 116, respectively. When one of these gates 106 or 116 is opened, the number contained in its associated memory is reentered into the pulse counter 10. For example, if gate 106 is opened the number then contained in memory 104 will be reentered into pulse counter 10. The memories are so constructed that the transfer of their contents into the pulse counter 10 is non-destructive, that is, the number memorized remains in the memory after transfer into the pulse counter. In addition, the pulse counter is so constructed that its count is not destroyed when it is transferred into a memory. Suitable counters and memories for such an application comprise master and slave sections of each stage. Non-destructive output is taken from the slave section while an input at the master section will cause that stage to assume the state of the input. In this case each of the leads generally designated 25 is actually a pair of leads so that the group designated 25 is comprised of seven pairs of leads, each pair being connected to a particular stage of counter 10. For example, one of the pairs is connected to the slave section of the stage and comprises the stage output. This output is connected to the phase locked loops, decoder and gates 102 and 112. The other one of the pairs is connected to gates 106 and 116. Of course, the outputs from gates 102 and 112 are connected to the master sections of memories 104 and 114, respectively, while the slave sections of the memories are connected to gates 106 and 116.

Associated with each memory is a single pole, double throw switch, for example, switches 108 and 118 associated with memories 104 and 114, respectively. These switches are ganged directly to radio pushbuttons 110 and 120, respectively. In this embodiment only two memories and their associated gates and switches are shown. In a broadcast receiver built in accordance with the principles of this invention any practical number of memories and associated elements can be used, for example, either five or ten memory units. If five memory units are used, of course five pushbuttons will be associated therewith. It should also be obvious that any memory is capable of setting up either an AM or FM channel depending upon the position of band switch 68.

Referring to memory 104 and its associated elements, the operation of a memory is now described. Assume first, that the radio receiver is tuned to a particular station and it is desired to set up this station in memory 104. Since the receiver is tuned to the particular station there is contained in counter 10 a number that uniquely identifies the station channel. Pushbutton 110 is pulled in the direction of the SET arrow so that switch arm 108*a* connects to contact 108*b*. This applies a qualifying signal from terminal 113 (from a source not shown) to contact 108*b*. The qualifying signal is suitably some voltage level which will open gates 102. When the gates open, the count contained in counter 10 will be entered into memory 104 as previously described. The pushbutton is then returned to the neutral position shown. Suitably, switch 108 is a single pole, double throw switch as shown having a center neutral position and momentary contacts.

Assume that the memory has been set as previously described and the receiver has been tuned to a different station and it is now desired to tune to the station set up in memory 104. It is merely necessary to move pushbutton 110 in the direction of the TUNE arrow so that arm 108*a* connects to contact 108*c* thus opening gate 106. As previously described, the number memorized in memory 104 passes through gate 106 and directly into counter 10 thereby tuning the receiver to the desired station.

As mentioned earlier, flip flop 50 permits the receiver to be tuned in a signal seek mode. Flip flop 50 is normally in a reset state so that the set signal on line 50*a* is extinguished. Line 50*a* connects as one input to AND gate 16 so that gate 16 is normally closed. If it is desired to switch to a seek mode, contact 51, which is normally open, is momentarily closed thus applying a set signal designated as A+ to the set terminal of flip flop 50. The flip flop thus generates an output signal on line 50*a* to thus open gate 16. Clock pulses from clock 12 pass through this gate and gate 18 to pulse counter 10. Since switch arm 22 connects to contact 22*a* and UP terminal 10*a* the clock pulses will be added to counter 10 and the receiver tuned upward through the broadcast band. A carrier detector 72 is associated with receiver circuits 70 and generates an output when a station carrier is present. This output is on line 50*b* which is connected to the flip flop reset terminal. When the carrier is detected, indicating that a station is being received, the flip flop is reset thus extinguishing the signal on line 50*a* and closing gate 16.

Figure 2:
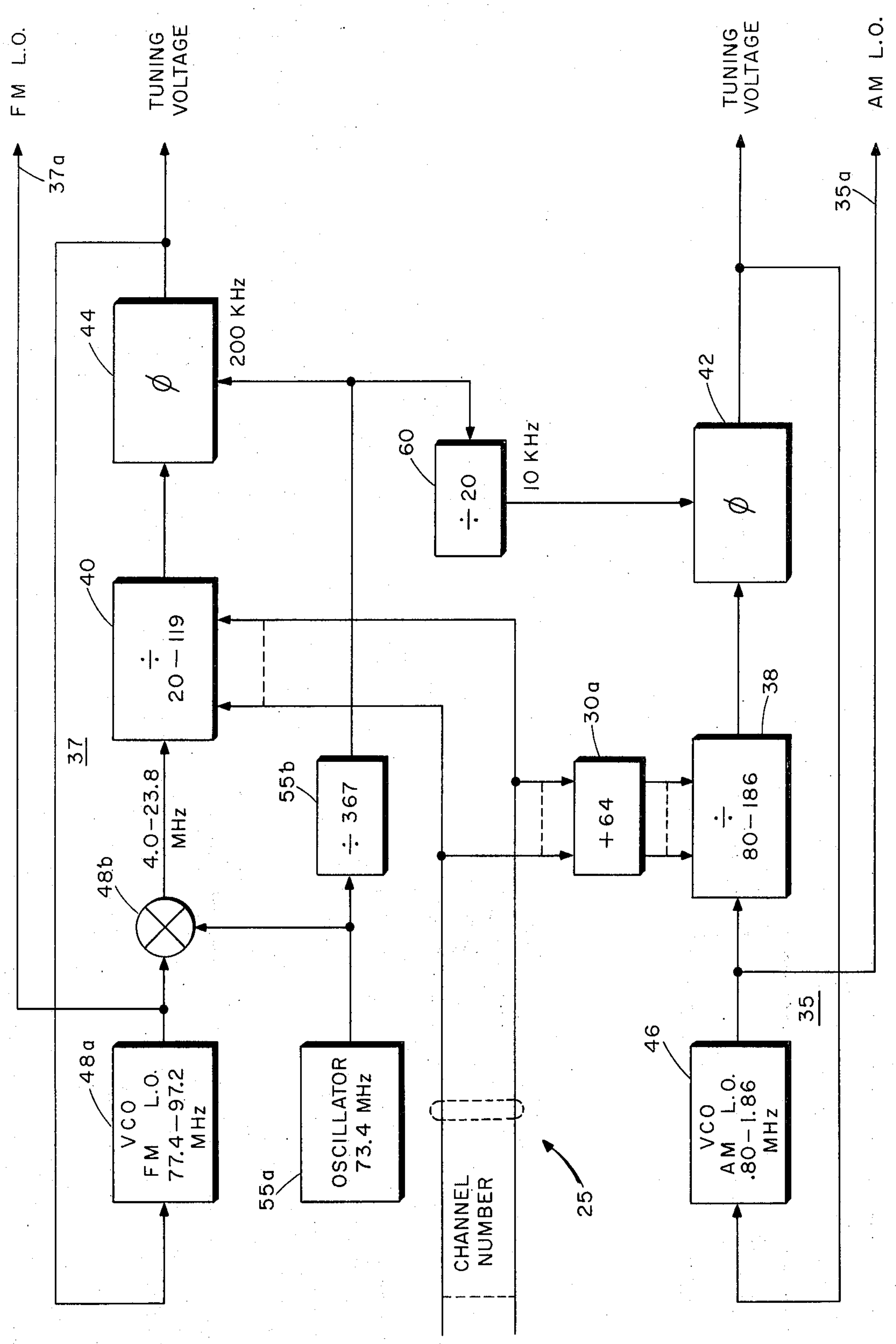
FIG. 2 shows the phase locked loops in greater detail.

Refer now to FIG. 2 where the same elements are shown with the same reference numerals as in FIG. 1. As earlier described, the AM phase locked loop is comprised of VCO 46, which generates the AM local oscillator frequencies from 0.80 to 1.86 MHz, divider 38 which has divisors 80 and 186 and phase detector 42. The FM phase locked loop is comprised of phase detector 44, divider 40 which has divisors 20 to 119 and a VCO comprised of local oscillator unit 48*a* which generates the FM local oscillator frequencies from 77.4 to 97.2 MHz and a mixer 48*b* for generating the phase locked loop frequencies. In addition the reference frequency source 55 of FIG. 1 is seen to be comprised of oscillator 55*a* which generates a signal at 73.4 MHz and a divide by 367 counter 55*b*. The output from this latter counter is a signal at 200 KHz which is the reference signal for phase locked loop 37. The 200 KHz signal is divided down by the divide by 20 counter 60 to generate the 10 KHz reference for Am phase locked loop 35. The signal at 73.4 MHz from oscillator 55*a* is mixed with the FM local oscillator frequency from oscillator 48*a* in mixer 48*b* to produce the difference signal at 4.0 to 23.8 MHz required by the FM phase locked loop.

Leads 25 carry the channel number information from counter 10 of FIG. 1, via code converter 30, if used, to divider 40. It can thus be seen that when in the FM mode counter 10 of FIG. 1 suitably counts between 20 and 119.

The channel number is increased by 64 by element 30*a* for use in the AM phase locked loop 35. It can thus be seen that when in the AM mode counter 10 of FIG. 1 suitably counts between 6 and 122.

As earlier explained, the AM local oscillator frequency is available at terminal 35*a* and the FM local oscillator frequency is available at terminal 37*a*.

Use of this invention will normally require tuning of the receiver antenna and R.F. circuits. As known in the art, varactors can be used to tune these circuits. The phase locked loop tuning voltages available from phase detectors 42 and 44 are available for application to the varactors associated with the antenna and R.F. circuits to tune those circuits.

Although only a single embodiment of the invention has been shown, it should be obvious that certain alterations and modifications can be made thereto without departing from the spirit of the invention. For example, it might be desired to add an extra stage to the receiver band switch so as to turn off the particular phase locked loop which is not being used at that time. In addition, the code converter interfacing the digital portion of the tuner with the phase locked loops might be any one of those types known to those skilled in the art, the only requirement being that the count in pulse counter 10 be used to change the divisors in the phase locked loops. In addition, in a particular application it might be desired that pulse counter 10 count up to a final count and then reverse and count down towards the initial count rather than counting up to the final count and then immediately going to the initial count and repeating as in this particular embodiment. The various ways in which the counter 10 may be connected are well known to those skilled in the art and should not be considered as comprising a limitation on the invention. It is also within the capability of one skilled in the art to provide a clock 12 whose pulse repetition frequency will vary in accordance with an applied signal. This signal might be applied from the tuning knob to provide an adjustable rate of tuning speed, for example, a relatively rapid tuning speed for a rapid scan of the band and a slower tuning speed as the desired station is approached. As a further example, other types of solid state memories requiring a minimum of power are known which are suitable for use in this invention. Recirculating memories and their use are well known. Thus one skilled in the art might readily use a recirculating pushbutton memory and alter the memory associated gating means in accordance therewith without departing from the invention. Generally, solid state memories require only very small amounts of power to retain the number stored therein. It is thus contemplated that the memories will be connected directly to the power source such as the battery in an automobile receiver with practically insignificant resulting battery drain. A capacitor or small auxiliary battery might be used to maintain memory integrity in cases where the main battery is removed if desired. These and other modifications and alterations will suggest themselves to one skilled in the art. Accordingly, the invention should be limited only by the true scope and spirit of the appended claims.

The invention claimed is:

1. A pulse tuning control system for a radio receiver which tunes across a first broadcast band of interest and at least an additional broadcast band of interest, said system comprising:

a source of pulses;

a binary counter for generating a binary number related to the number of pulses applied thereto;

operator controlled means for applying said pulses to counter;

a first phase locked loop including a divide by N divider for generating a plurality of local oscillator frequencies as N varies a unique local oscillator frequency being generated in response to an associated unique value of N, said radio receiver being tunable across said first broadcast band of interst as N varies to thereby vary the local oscillator frequency generated;

means for setting the value of N in accordance with the binary number generated by said counter;

at least a second phase locked loop including a divide by $N_1$ divider for generating a second plurality of local generator frequencies as $N_1$ varies, a unique one of said second plurality of local oscillator frequencies being generated in response to an associated unique value of $N_1$;

switch means for selecting the first mentioned plurality of local oscillator frequencies when in a first position, whereby said radio receiver is tuned across the first mentioned broadcast band of interest and for selecting said second plurality of local oscillator frequencies when in a second position whereby said radio receiver is tuned across said additional broadcast band of interest; and, means for setting the value of $N_1$ in accordance with the binary number generated by said counter.

2. The system of claim 1 with additionally:

at least one binary memory for memorizing a binary number applied thereto;

first gate means for applying the binary member generated by said counter to said memory when said first gate means is enabled;

second gate means for applying the binary number memorized by said memory to said counter when said second gate means is enabled, said counter thereafter generating said memorized binary number; and, switch means for selectably enabling said first gate means, said second gate means and neither of said gate means.

3. A pulse tuning control system for a radio receiver which tunes across a broadcast band of interest wherein said radio receiver detects a carrier frequency generated by a remote broadcast station when said radio receiver generates the local oscillator frequency associated with said remote station, said system comprising:

a source of pulses;

a binary counter for generating a binary number related to the number of pulses applied thereto;

operator controlled means for applying said pulses to said counter;

at least one phase locked loop including a divide by N divider for generating a plurality of local oscillator frequencies as N varies, a unique local oscillator frequency being generated in response to an associated unique value of N, said radio receiver being tunable across said braodcast band of interest as N varies to thereby vary the local oscillator frequency generated;

means for setting the value of N in accordance with the binary number generated by said counter;

a further means for applying said pulses to said counter, said further means being operator latched for applying said pulses to said counter when latched and responsive to an unlatching signal for stopping the application of said clock pulses to said counter; and, means responsive to the detection of a carrier frequency by said radio receiver for generating said unlatching signal.

4. The system of claim 3 with additionally:

at least one binary memory for memorizing a binary number applied thereto;

first gate means for applying the binary number generated by said counter to said memory when said first gate means is enabled;

second gate means for applying the binary number memorized by said memory to said counter when said second gate means is enabled, said counter thereafter generating said memorized binary number; and, switch means for selectably enabling said first gate means, said second gate means and neither of said gate means.

5. A pulse tuning control system for a radio receiver which tunes across a broadcast band of interest comprising:

a source of pulses;

a binary counter for generating a binary number related to the number of pulses applied thereto;

means for applying said pulses to said counter;

at least one phase locked loop including a divide by N divider for generating a plurality of local oscillator frequencies as N varies, a unique local oscillator frequency being generated in response to an associated unique value of N, said radio receiver being tunable across said broadcast band of interest as N varies to thereby vary the local oscillator frequency generated;

means for setting the value of N in accordance with the binary number generated by said counter;

at least one memory for memorizing a binary number applied thereto;

first gate means for applying the binary number generated by said counter to said memory when said first gate means is enabled;

second gate means for applying the binary number memorized by said memory to said counter when said second gate means is enabled, said counter thereafter generating said memorized binary number; and, switch means for selectably enabling said first gate means, said second gate means and neither of said gating means.

6. The system of claim 5 wherein said switch means includes a radio pushbutton.

* * * * *